United States Patent [19]

Allan

[11] 4,322,824
[45] Mar. 30, 1982

[54] STATIC RANDOM ACCESS MEMORY WITH MERGED BIT LINES

[75] Inventor: James D. Allan, Missouri City, Tex.

[73] Assignee: Texas Instruments Incorporated, Dallas, Tex.

[21] Appl. No.: 93,776

[22] Filed: Nov. 13, 1979

[51] Int. Cl.³ .............................................. G11C 11/40
[52] U.S. Cl. ...................................... 365/185; 365/174
[58] Field of Search ........................ 365/185, 183, 174

[56] References Cited

U.S. PATENT DOCUMENTS 4,128,773 12/1978 Troutman ........................... 365/185

Primary Examiner—Terrell.W. Fears
Attorney, Agent, or Firm—John G. Graham

[57] ABSTRACT

A static Random-Access-Memory having a single bit line between each pair of adjacent columns of memory cells, implemented in a self-aligned, N-channel, silicon-gate system. Resistor element load devices are made in second-level polycrystalline silicon by an ion implant step. The second-level polycrystalline silicon is insulated from the first-level polycrystalline silicon by a multiple oxide insulation layer. An additional word line for each row of memory cells provides differentiation between adjacent memory cells sharing a single bit line.

17 Claims, 13 Drawing Figures

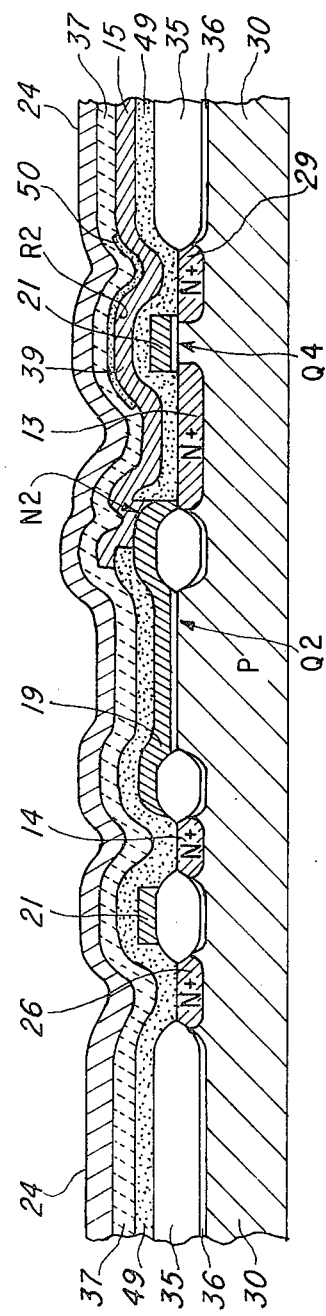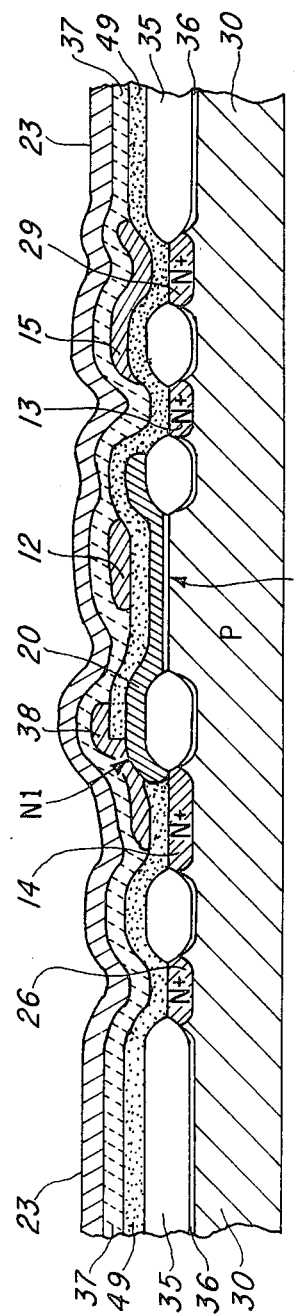
Fig. 3d
Fig. 3e

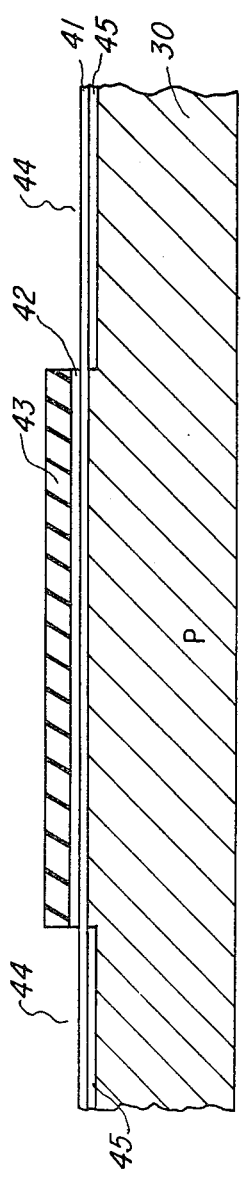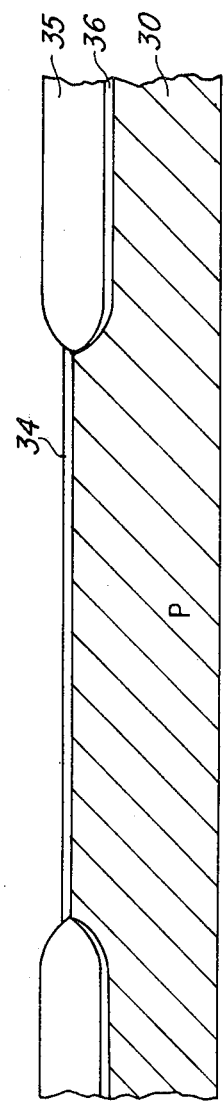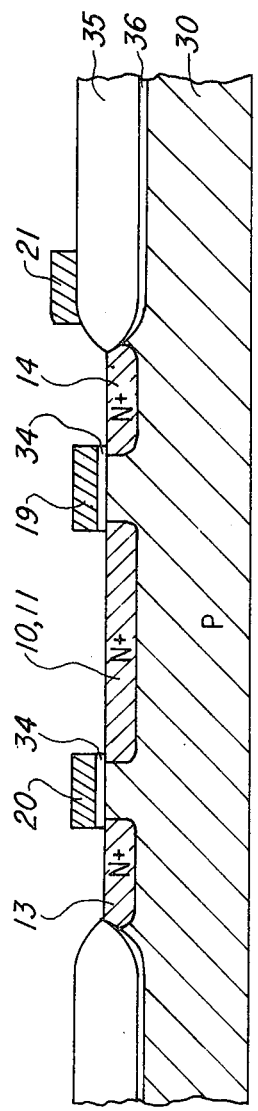

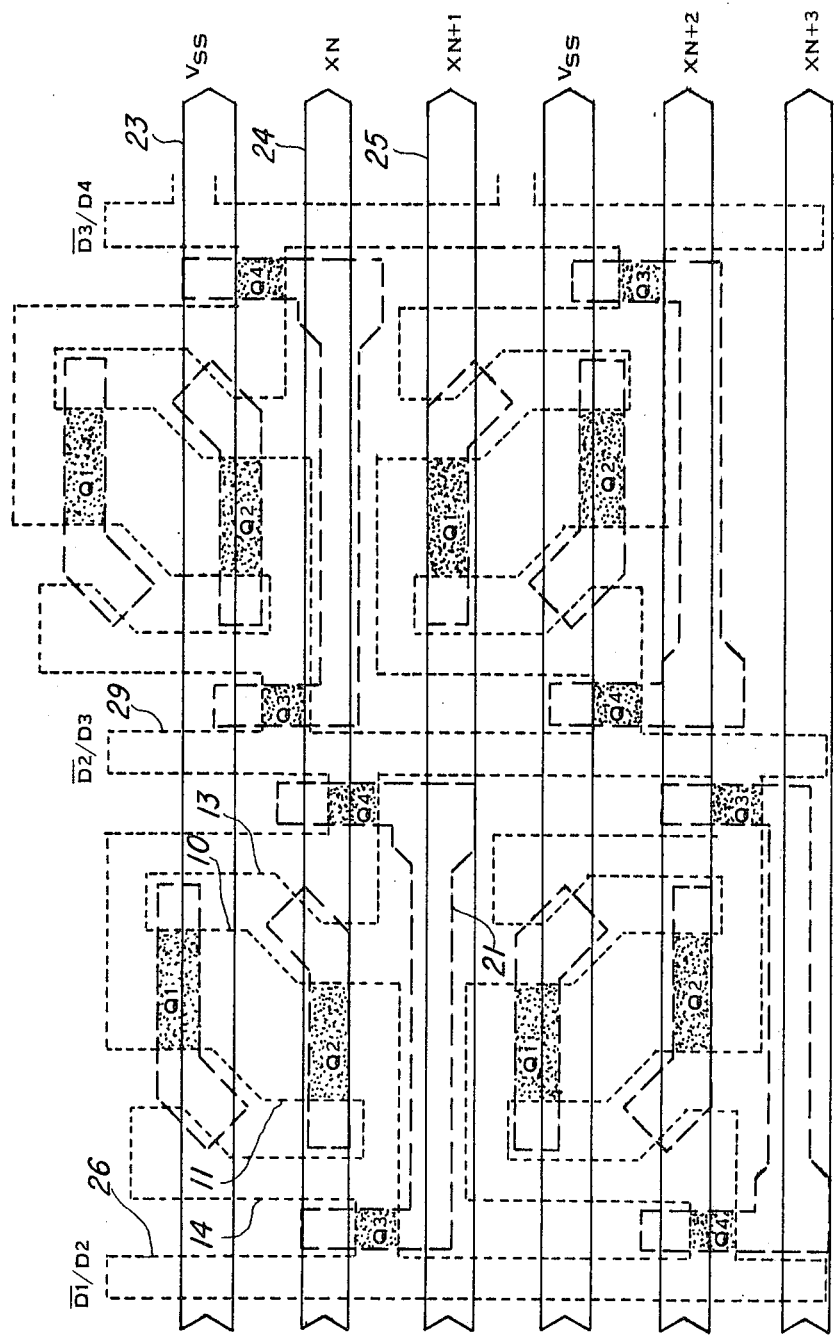

STATIC RANDOM ACCESS MEMORY WITH MERGED BIT LINES

BACKGROUND OF THE INVENTION

This invention is directed to semiconductor memories and to methods of making such devices, and more particularly to static Random Access Memories implemented in MOS integrated circuits.

In early semiconductor integrated circuits, resistors were provided by diffused regions or by portions of the semiconductor substrate which were defined by etching, as seen in U.S. Pat. No. 3,138,743, issued to Jack S. Kilby. As the density of components grew, the area occupied by resistors became prohibitive, so logic forms were favored which used few resistors or no resistors. For example, "TTL" or Transistor-Transistor Logic, and I²L for integrated injection logic in bipolar technology had features minimizing the area on a bar dedicated to resistors. In MOS logic and memories, transistors are used as load devices or, in effect, as resistors. Examples of very complex MOS circuits containing many thousands of transistors, but no resistors, in a single chip digital processor or memory are shown in U.S. Pat. No. 3,940,747, issued to Kuo and Kitagawa and U.S. Pat. No. 3,998,604, issued to J.H. Raymond, Jr..

High density MOS memory devices such as the 4096 bit memory described in U.S. Pat. No. 3,940,747, or the "16K" or 16384 bit memory described in U.S. Pat. No. 4,031,415 by N. Kitagawa, have been of the dynamic type because dynamic 1-transistor cells are the smallest in area. In some parts of digital equipment, however, the refresh circuitry required for dynamic memories is incompatible or undesirable, so static memory is preferred. Static cells traditionally employ 6-transistor bistable circuits wherein depletion-load MOS transistors are used as load devices. These cells are much larger than the one transistor cells of dynamic memory devices, so accordingly the density is less. Also, power dissipation is high due to the requirement that some current must flow through one side of each cell in the array to maintain the stored data. In co-pending Application Ser. No. 691,252, filed May 28, 1976 by G. R. Mohan Rao, assigned to Texas Instruments, there is disclosed a resistor element particularly suited for a static RAM cell wherein the resistors are implanted regions buried beneath field oxide. In U.S. Pat. No. 4,110,776, by Rao, Stanczak, Lien, and Bhatia, a static cell using implanted resistors in a polycrystalline silicon over field oxide is described. In co-pending Application, Ser. No. 048,961, filed June 15, 1979, by Jih-Chang Lien and Te-Lang Chiu, assigned to Texas Instruments, a static cell, using resistors imiplanted in second-level polycrystalline silicon is disclosed. While these inventions represent marked improvements, further reduction in cell size is needed for arrays of the "16K" or larger size.

It is therefore, a principal object of this invention, to provide a method for making an improved small area static RAM cell for MOS memory devices of high density. Another object of this invention is to provide small area, high resistance load elements for use in a small area static RAM cell.

SUMMARY OF THE INVENTION

In accordance with the invention, a static Random-Access-Memory having a single bit line between each pair of adjacent columns of memory cells, is implemented in a self-aligned N-channel, silicon-gate device. Load resistor elements are made in second-level polycrystalline silicon by an ion implant step. The second-level polycrystalline silicon is insulated from the first level polycrystalline by a multiple oxide insulation layer. An additional word line for each row of memory cells provides differentiation between adjacent memory cells sharing a single bit line.

BRIEF DESCRIPTION OF THE DRAWINGS

FIGS. 3a–3e are elevation views in section of the cell of FIG. 1, taken along the lines a—a, b—b, c—c, d—d and e—e, respectively;

FIGS. 4a–4e are elevation views in section of the semiconductor device of FIGS. 1 and 3b, at successive states in the manufacturing process, taken along the line b—b in FIG. 1; and FIG. 5 is a plan view of the layout of the cell of the FIG. 1 in an array.

DETAILED DESCRIPTION OF SPECIFIC EMBODIMENT

Figure 1:
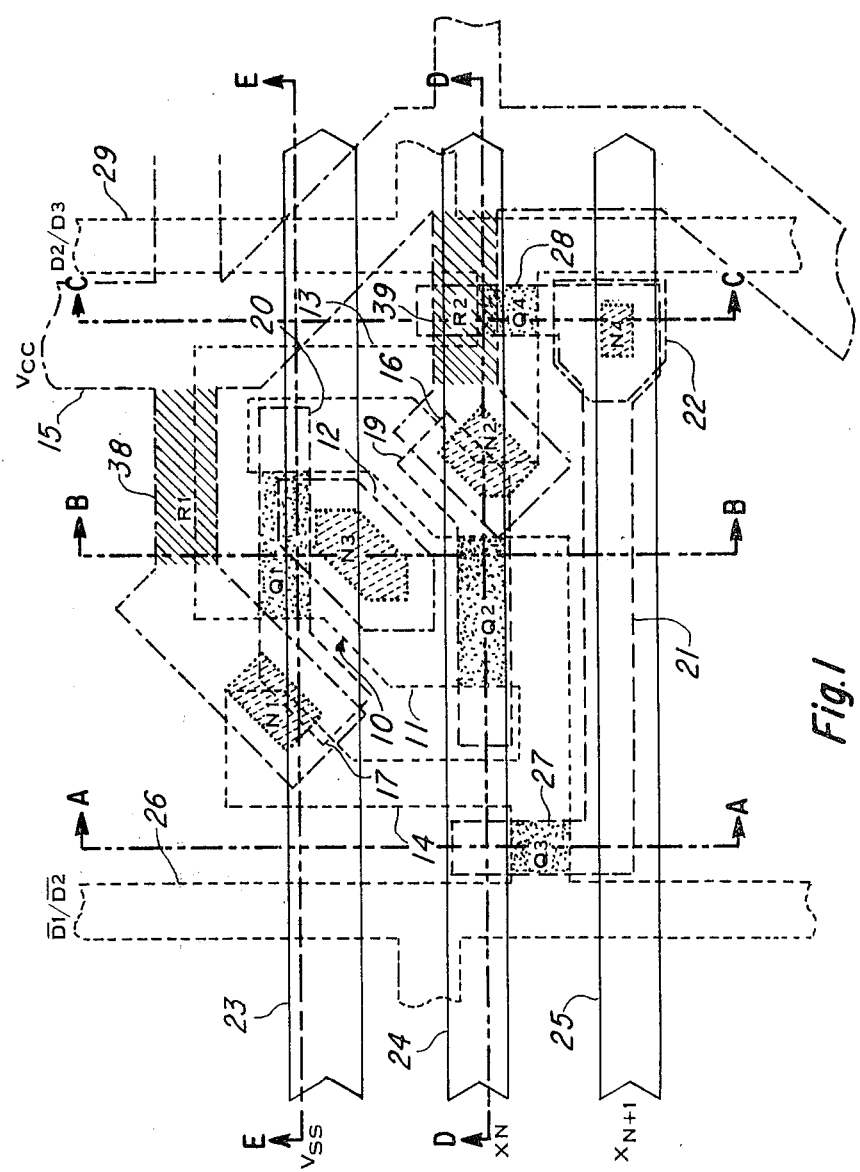
FIG. 1 is a greatly enlarged plan view of a small portion of a semiconductor chip showing the physical layout of a static RAM cell using the features of the invention.

In FIG. 1 a physical layout is shown of an N-channel, silicon gate MOS static RAM cell which utilizes the features of the invention. This cell is of course greatly enlarged in FIG. 1, as it would actually occupy only about 1.0 to 1.5 square mils, i.e., the larger dimension of the cell of FIG. 1 would be less than two mils. The cell is also shown in FIG. 2 as one of an array of cells in an electrical schematic diagram, with parts numbered the same as in FIG. 1.

Figure 2:
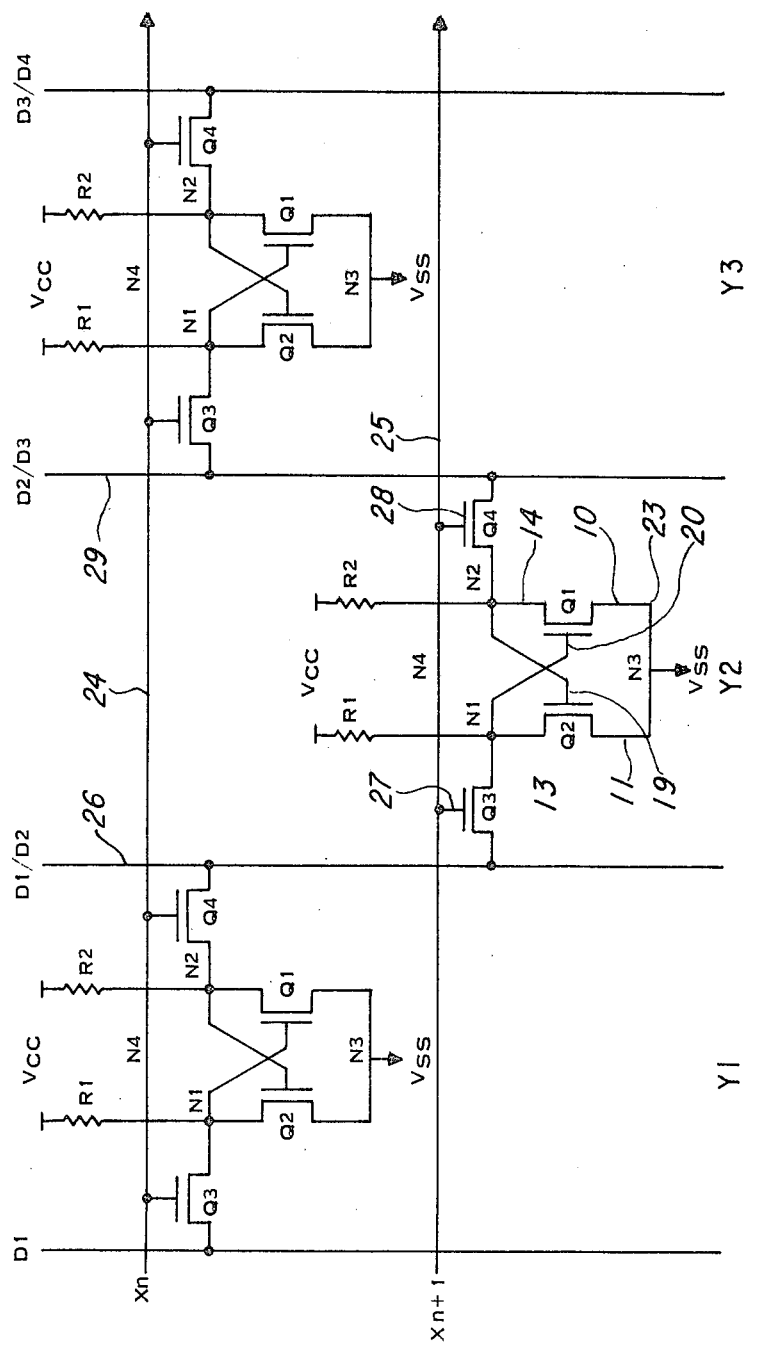
FIG. 2 is an electrical schematic diagram of three adjacent cells of the type shown in FIG. 1.

The cell of FIGS. 1 and 2 consists of a pair of cross-coupled driver transistors Q1 and Q2 each of which has a source 10 or 11 in the form of an N+ region which is connected via node N3 through second-level polycrystalline silicon region 12 to an elongated metal strip 23, which is a ground or Vss line. Each transistor has an N+ drain region 13 or 14 which is electrically connected via nodes N1 and N2 to a Vcc or positive supply line 15 through resistor R1 or R2. The resistors R1 and R2 are formed by ion implantation in a second-level polycrystalline silicon layer according to a feature of this embodiment of the invention. The Vcc supply line 15 is an elongated heavily doped region of the second-level polycrystalline silicon. A contact area 16 of drain 13 of the transistor Q1 is connected to a first-level polysilicon strip 19, which forms the gate of transistor Q2, and to node N2. In a like manner, contact area 17 of drain 14 of transistor Q2 is connected to the first level polysilicon strip 20, which forms the gate of transistor Q1, and to node N1, thus, providing the cross-coupling connection of a bistable or flip-flop circuit. Elongated N+ regions provide bit lines 26 and 29 (labeled in FIG. 1 as $\overline{D1/D2}$ and D2/D3). Bit lines 26 and 29 are connected to nodes N1 and N2 via coupling transistors Q3 and Q4. Gates 27 and 28 of transistors Q3 and Q4 are formed in an elongated first-level polysilicon region 21 which is connected to word address line 25 via node or contact area N4 in second-level polysilicon region 22. Word address line 25 is an elongated metal strip.

Referring now to FIGS. 3A–3E, sectional views of the cell of FIG. 1 show the details of construction. The cell is a small part of a substrate 30 of P-type silicon. The transistors Q1, Q2, Q3 and Q4 are formed in elongated moat regions in which N+ diffused regions 10, 11, 13 and 14 create the source and drain regions for the transistors. A thin silicon gate dielectric layer 34 and phosphorus-doped first-level polysilicon areas 19, 20 and 21 form the gates of the transistors and the interconnects. The polysilicon strips which form the gates of transistors of Q1 and Q2 include the cross-coupling interconnects 16 and 17 to drain regions 13 and 14. Thick field oxide 35 exists at all areas where moats including N+ diffused regions or resistors, do not exist, and a P+ boron-doped, channel-stop region 36 is created under all areas of the field oxide 35. An insulating layer 37 is formed over the entire top surface, overlying the polysilicon, the field oxide 35, and the N+ regions. Lines 23, 24 and 25 are metal strips overlying this insulating layer 37.

Figure 3A:
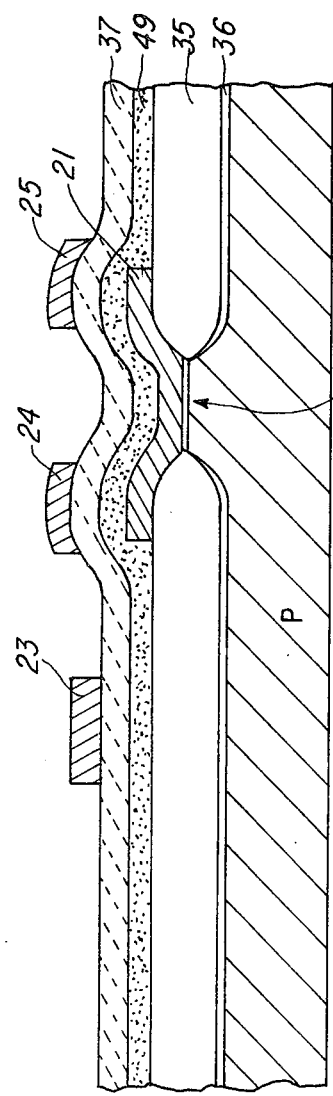
Figure 3B:
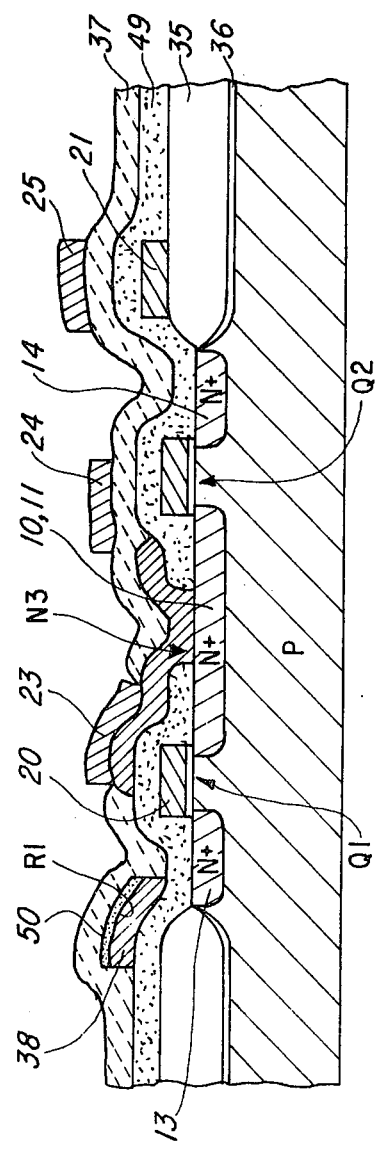
Figure 3C:
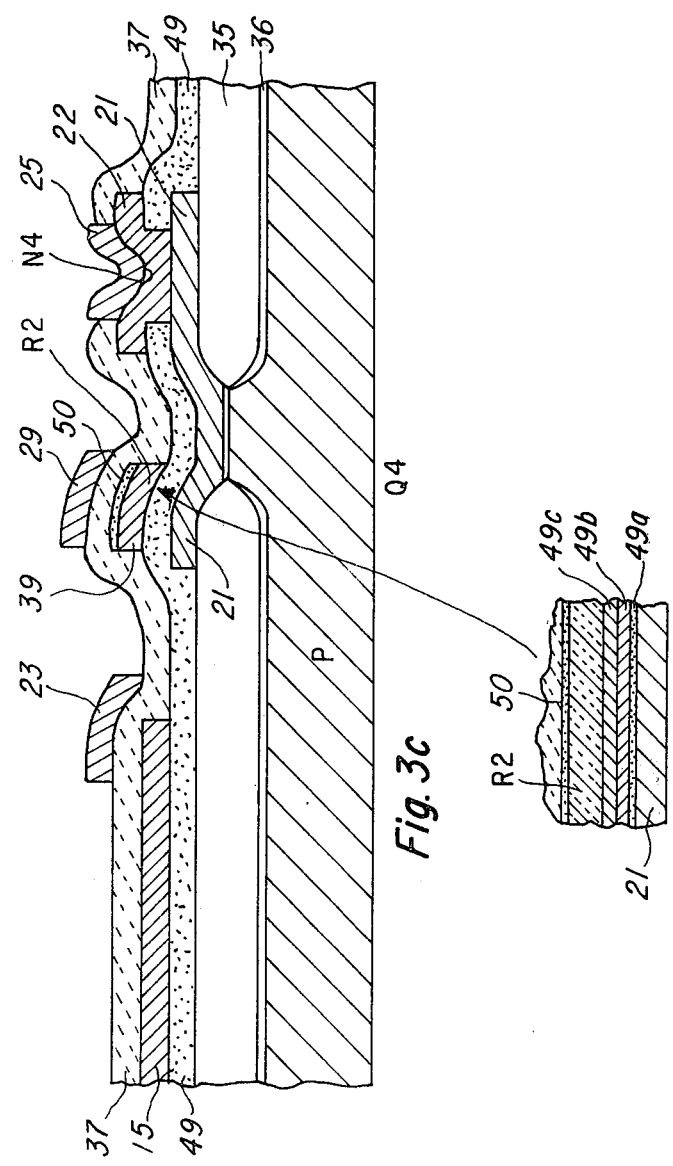

As seen in FIGS. 3b, 3c, and 3d, the resistors R1 and R2, in the embodiment disclosed, consist of phosphorus ion implanted portions of second-level polycrystalline silicon strips 38 and 39 which extend from the Vcc line 15. The remainder of the strips 38 and 39 as well as the line 15, except for resistors R1 and R2, is heavily doped with phosphorus so that it will be highly conductive. The size of the resistor R1 or R2 is about 0.12 mil × 0.4 mil in area as seen in plan view FIG. 1, and about 5,000 Å or 0.5 micron in thickness, as seen in section views in FIGS. 3b, 3c, and 3d. The resistor is seen to overlay drain region 13, and gate 28 of transistor Q4. This results in a saving in space on the chip which is quite significant. Also, the second-level polysilicon in which the resistors are formed does not form the gates of transistors, so it is less critical. The use of second-level polysilicon further allows the Vcc line to underlie the Vss line, which conserves additional space. The cell of FIGS. 1–3 is potentially about ⅓ the size of static memory cell which uses implanted resistors in single level polysilicon as disclosed in U.S. Pat. No. 4,110,776.

Static RAM memories have traditionally used polysilicon as the word line conductor. Polysilicon causes an inherent RC time delay between the generation of the word line signal and the selection of a cell at the end of the word line. A feature of the present invention is the use of aluminum as a word line conductor, line 25, thus eliminating the word line RC delay. The RC delay associated with the bit lines, 26 and 29, can be minimized by minimizing the bit line voltage swing. The invention also has the advantage over conventional separate bit line devices in that the number of cells accessed by each word line is halved, and thus the capacitive loading is also halved.

Figure 4D:
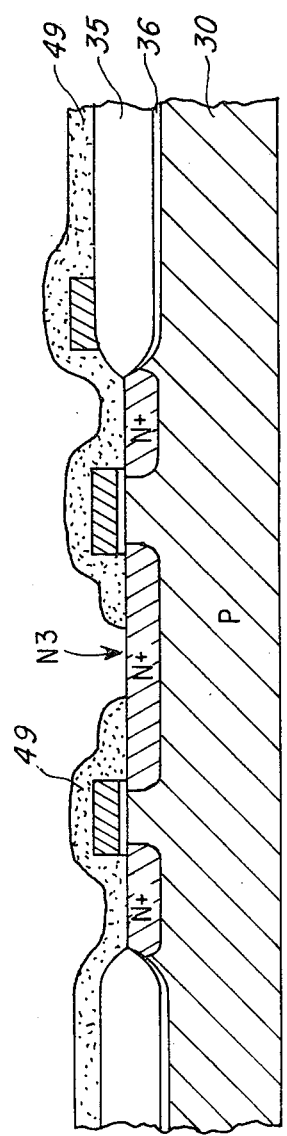

The embodiment disclosed utilizes a triple-level insulator 49, which insulates the first level polysilicon from the second-level polysilicon. This insulator includes a lower level 49a which is thermal oxide of about 500 Å in thickness functioning as a thermal refill for better transistor edge breakdown. A second-level insulator 49b is a doped chemical-vapor-deposited (CVD) oxide of about 1,500 Å in thickness which provides better step coverage. After densification, this layer will smooth out the step of the first-level polysilicon and also it will prevent micro-cracking of the oxide around the edges of the first-level polysilicon. Third, a layer 49c of undoped CVD oxide of about 2,000 Å in thickness prevents phosphorus doping of the second-level polysilicon from the doped layer 49b during subsequent heat cycles. Out diffusion from the layer 49b would lower the resistance of the lightly doped material of the resistors R1 and R2. The magnitude of each of the resistors R1 and R2 is about 5 M ohm or more; a large value for these resistors functions to reduce power consumption in a large array of static cells. Each cell will have one transistor "on" and one "off," storing a "1" or "0," and the on transistor will have a high resistance in series with it to minimize power drain, while the off transistor and its high resistance load will allow bit lines 26 and 29 to charge to a "1" state if the cell is addressed. The node N1 or N2 will then remain at the high logic level of the bit line when addressed and will rise to Vcc when not addressed. Current dissipation, assuming the resistors R1 and R2 are five megohm, is one microamp per cell, or 16 milliamps for a 16 K array; power dissipation would be 80 milliwatts. Resistors R1 and R2 can be increased to values exceeding 20 megohms. Referring now to FIGS. 4a–4e, a process for making the N-channel, silicon-gate, self-aligned, double-level polysilicon, MOS integrated circuit device of FIGS. 1 and 3a–3e will be described. The starting material is a slice of P-type monocrystalline silicon, perhaps three inches in diameter and 20 mils thick, cut on the <100> plane, of a resistivity of about 30 to 40 ohm-cm. In FIGS. 3b or 4a, a wafer or body 30 represents a very small part of the slice, of about 1.5 mil in lateral dimension, chosen as a representative sample cross section. First, after appropriate cleaning, the slice is oxidized by exposing to oxygen in a furnace at an elevated temperature of perhaps 1,000° C. to produce an oxide layer 41 of a thickness of about 1,000 Å. Next, a layer 42 of a silicon nitride $Si_3N_4$ about 1,000 Å thick is formed by exposing to an atmosphere of silane and ammonia in an rf reactor. A coating 43 of photoresist is applied to the entire top surface, then exposed to ultraviolet light through a mask which defines the desired pattern, and developed, leaving areas 44 were nitride is to be etched away and field oxide 35 is grown. Alternatively, smaller geometries and thus smaller cell sizes may be obtained by using electron beam lithography in place of ultraviolet light and glass mask to expose the photoresist, as disclosed in Bell Laboratories Record, March 1976, pages 69–72 and Electronic Products, February 1977, page 17. The slice is subjected to a plasma etch, which removes the part of nitride layer 42 not covered by the exposed photoresist 43, but does not remove oxide layer 41 and does not react with photoresist 43.

The slice is next subjected to an ion implant step, whereby boron atoms are implanted in areas 44 of silicon not covered by photoresist 43 and nitride 42. The photoresist is left in place as an implant mask. Boron is an impurity which produces P-type conductivity, so more heavily doped P+ regions 45 will be produced in the surface. Oxide layer 42 is left in place during implant because it prevents the implanted boron atoms from out-diffusing from the surface during subsequent heat treatment. The boron implant is at a dosage of about $4 \times 10^{12}/cm^2$ at 100 KeV. After the implant, photoresist layer 43 is removed.

As will be seen, the regions 45 do not exist in the same form in the finished device, because some of this part of the slice will have been consumed in the oxidation procedure. Implanted region 45 will ultimately produce P+ channel stop regions 36.

As set forth in U.S. Pat. No. 4,055,444 issued to G. R. Mohan Rao, the next step in the process is to subject the slice to a heat treatment or annealing step, during which the slice is maintained at a temperature of about 1,000° C. for about 2 hours in an inert atmosphere, preferably nitrogen. This step causes the boron concentration of change markedly, which has desirable effects aside from reduction in bulk damage in the crystal structure. P+ regions 45 penetrate deeper into the silicon surface during this anneal step.

The following step is a formation of field oxide, which is done by subjecting the slice to steam or an oxidizing atmosphere at about 950° C. for perhaps 10 hours. As seen in FIG. 4b, this causes a thick field oxide region, or layer, 35 to be grown, and this region extends into the silicon surface, because silicon is consumed at it oxidizes. Nitride layer 42 masks oxidation beneath it. The thickness of this layer 35 is about 8,000 to 10,000 Å, half of which is above the original surface and half below. Boron doped P+ region 45 as previously implanted and modified by the anneal step will be partly consumed, but will also diffuse further into the silicon ahead of the oxidation front. Thus, P+ regions 36 which result will be deeper and of more uniform and acceptable concentration at the surface compared to what would have resulted without the anneal step. Also, regions 36 will not have the extent of crystalline structure damage characteristic of implanted devices.

Nitride layer 42 and its underlying oxide layer 41 are removed by etching, as the next step, and another thin silicon oxide layer 34 of about 500 Å in thickness is grown over the exposed area of silicon.

At this time, although not reflected in the FIGURES, two ion implant steps can be performed to create the desired threshold or operating parameters in transistors in the integrated circuit. First, boron is implanted in all moat areas at 50 KeV to a dosage of about $2.0 \times 10^{11}$ atoms per cm$^2$ for the purpose of adjusting the threshold voltage of thin oxide, enhancement mode transistors, so that substrate bias voltage will not be needed. Then, a photoresist layer is applied and patterned to expose the channel areas of depletion load transistors in peripheral circuitry, not in the cell array. These areas are then subjected to a phosphorus implant at 100 KeV with a dosage of about $7 \times 10^{11}$ per cm$^2$. This phosphorus implant is selected to produce high-speed devices in the peripheral circuit. As explained in U.S. Pat. No. 4,110,776, if depletion load transistors had been used in place of the resistors R1 and R2 in the cell array, then attaining low standby power dissipation would have been the most important factor, rather than speed in the peripheral circuits, and so speed in terms of access time would be compromised. In addition, of course, the use of resistors R1 and R2 in second-level polysilicon reduces the cell size.

Next, a layer of polycrystalline silicon is deposited over the entire slice in a reactor using standard techniques, for example, by decomposition of silane in hydrogen at an elevated temperature to a thickness of 0.4 to 0.6 micron, producing the first-level polysilicon, which is then patterned using photoresist to form strips 19, 20 and 21. The resulting structure is seen in FIG. 4c. At the same time, using the photoresist which patterns the first-level polysilicon, thin oxide 34 is removed in all exposed areas, leaving oxide only in the transistor gate area (plus capacitor areas, not shown, which may be needed in peripheral circuitry, as in boot-strap circuits).

Using the remaining first-level polysilicon coating and thin oxide 34, as well as the field oxide, as a mask, the slice is now subjected to an N+ ion implant step. Arsenic is implanted and then driven into silicon slice 30 to produce all of the N+ regions 10, 11, 13 and 14. The depth of these regions after drive is about 3,000 to 4,000 Å. The N+ regions function as source or drain regions of all the transistors. This implant renders highly conductive all of the exposed polysilicon areas.

In the embodiment disclosed, a triple-layer insulating coating 49 is next produced to isolate the first and second level polysilicon layers. After the source-drain arsenic implantation and 900° C. nitrogen anneal for 20 minutes, then 1,000° C. drive-in for proper junction depth, the first level 49a of the insulating code 49 is formed by thermal oxide grown over the first-level polysilicon by oxidation in dry O$_2$ at high temperature to produce a layer 49a of about 500 Å in thickness. Then, low temperature phosphorus doped oxide is deposited in a CVD reactor to a thickness of about 1,500 Å, producing a coating 49b. The layer 49b is densified at 1,000° C. in nitrogen for 15 minutes to smooth out the steps in the first level polysilicon. Next, the layer 49c is deposited to a thickness of 2,000 Å in a CVD reactor. This layer is undoped. The exposed silicon in the moat areas is oxidized so the coating 49 extends over the N+ regions 10, 11, 13 and 14. The first-level polysilicon is not consumed unnecessarily by thermal oxidation, yet the integrity of the thermal oxide is obtained and smooth transistions result, while the resistors are protected from out-diffusion. The thin oxide area of the chip is therefore held to a minimum, since the total thin oxide area is one of the primary factors influencing yield.

As seen in FIG. 4d, the oxide layer 49 is patterned using a photoresist to open contact area N3, that is, second-level polysilicon contact to moat area.

The second-level of polycrystalline silicon is now deposited using the same method as for the first-level, providing a thickness of about 0.5 micron.

The entire second-level polycrystalline silicon coating is next subjected to a phosphorus implantation which creates the characteristics of resistors R1 and R2. Areas of a polysilicon which are to be highly conductive will be later subjected to a phosphorus diffusion to leave them heavily doped. To define the resistor characteristics, this implant step is performed at 100 to 150 KeV to a dosage of from $1 \times 10^{13}$ to $2 \times 10^{13}$ phosphorus atoms per cm$^2$, depending upon the desired resistivity for resistors.

As reported by Bean et al, Journal of Applied Physics, Volume 40, No. 5, pp. 2358–2359, April 1969, the resistivity of a polycrystalline silicon is $5 \times 10^5$ ohms-cm with an apparent P-type concentration of $2.1 \times 10^{11}$ to $5.8 \times 10^{11}$/cubic cm, and a mobility of 33 to 430 cm$^2$/volt-sec. In polysilicon, as the thickness is decreased to less than 1 micron, the conduction will be along grain boundries, so resistivity in such case will be at least as high as $10^5$ ohms-cm. The sheet resistance will be Rx $\times 1/d$ or $10^5 \times 1/(0.5 \times 10^{-4})$, which is approximately $2 \times 10^9$ ohms per square. This would be too unstable with temperatures and too highly resistive. The phosphorus implant serves to produce a sheet resistance of ideally about 1–5 megohms per square at 25° C. Lower resistance results in too large a size, and higher resistance results in instability, non-reproducibility and excessive voltage dependents.

Figure 4E:
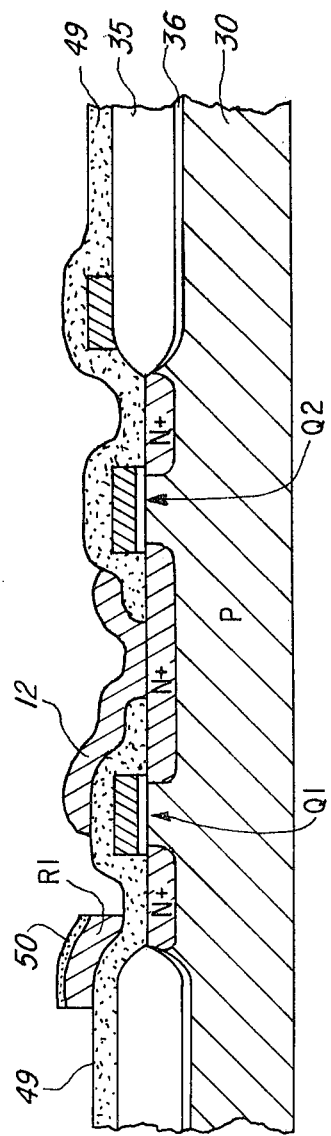

The second-level polysilicon coating is next patterned. This is done by applying a layer of photoresist, exposing to ultraviolet light through a mask prepared for this purpose, developing, then etching with the remaining photoresist masking certain areas of the polysilicon. The resulting structure is seen in FIG. 4e, where a part of the remaining polysilicon layer provides what will be extension 38 of line 15 and resistor R1 therein. In contrast to U.S. Pat. No. 4,110,776, no transistor gates are created by this layer of polycrystalline silicon, and indeed it overlies transistor gates in some areas.

After patterning the second-level polysilicon, a protective cap of silicon dioxide is grown on the polysilicon, producing a coating 50 on all exposed surfaces of the polysilicon. Coating 50 is grown at about 900° C. in steam for about two hours, producing approximately 2,500 A in thickness and consuming part of the polysilicon. The function of the cap is to prevent deposition of impurities on the resistors for diffusion into the resistors. A photoresist masking and etching operation is then used to remove the coating 50 on areas of polysilicon which are to be N+ diffused; coating 50 is left in place over the resistors R1 and R2. The masked second-level polysilicon is then subjected to a phosphorus deposition and diffusion, rendering the areas not covered by coating 50 highly conductive.

As seen in FIG. 3b, fabrication of the device is continued by depositing a thick layer 37 of phosphorus-doped oxide. Rather than by oxidizing, this is done by low temperature reaction process using conventional chemical vapor deposition techniques. A layer 37 of about 10,000 Å in thickness is produced, covering the entire slice. This deposition is followed by a "densification" step wherein the slice is heated at 1,000° C. for the purpose of eliminating minute holes or pores in the oxide. Subsequently, a photoresist operation opens windows in the oxide layer 37 in contact area N3 where metal to second-level polysilicon contact is to be made. A thin coating of polysilicon is applied to the slice at this point by plasma deposition. This coating is about 500 Å in thickness, and is applied for the purpose of avoiding spiking which can occur when aluminum contacts are applied over thin silicon regions. Spikes of aluminum-silicon compound can extend downwardly through the device and cause short circuits. The thin coating of deposited plasma polysilicon provided a source of silicon to be used in the formation of aluminum silicide under the contacts, so the silicon of the circuit below is not used.

Finally, a layer of aluminum is deposited on the entire slice, and selectively etched using photoresist masking to produce the desired pattern of metal strips 23, 24 and 25.

In an array of a large number of the cells of FIG. 1, the layout on the chip would make considerable economy of space by mirroring the cell about the axis of the center line of each but line (i.e. 26 and 29). Cells in adjacent columns can be staggered slightly to accomodate the additional word line necessary to differentiate between cells which share a bit line, producing the layout of FIG. 5. Although not shown in FIG. 5, adjacent cells share Vcc line 15, and as shown, share Vss line 23.

By sharing a single bit line between each pair of adjacent columns of memory cells, the space between adjacent columns is effectively minimized. In prior art static memories, an entire column of unused chip area existed between each column of cells, between the two adjacent bit lines previously required between columns. The additional word lines do not add to cell size since they overlie areas of the cell occupied by other features.

Thus, an array of a large number of cells of FIG. 1 will be appreciably smaller in area than an equal number of static cells not employing the merged bit line feature of this invention, and accordingly, the density of an integrated circuit device employing this feature of the invention will be appreciably greater.

ALTERNATIVE EMBODIMENTS

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What I claim is:

1. A static random access memory comprising: an array of a plurality of adjacent rows and columns of memory cells, said memory cells formed in a semiconductor integrated circuit having a semiconductor substrate and each of said memory cells including:
    a pair of driver transistors formed in said substrate at one face thereof;
    a pair of load devices;
    first conductive means at said one face connecting each of said driver transistors in series with one of said load devices; and
    second conductive means at said one face cross-connecting an output electrode of each of said driver transistors to a central electrode of the other of said driver transistors;
    the array including:
    a plurality of word lines for addressing said rows of memory cells; and
    a plurality of bit lines for addressing said columns of memory cells consisting of a single bit line disposed between each pair of said adjacent columns in the array of memory cells, the cells in each pair of adjacent columns sharing said single bit line.

2. The device according to claim 1, wherein said memory cells further include a first level of polycrystalline silicon on said one face providing said control electrodes of said driver transistors.

3. The device according to claim 2, wherein said first conductive means comprises a second level of polycrystalline silicon which has been heavily doped with a conductivity-determining impurity.

4. The device according to claim 3, wherein said pair of lead devices comprise regions within said second-level of polycrystalline silicon which are less heavily doped with said conductivity-determining impurity.

5. The device according to claim 4, wherein said plurality of word lines is comprised of elongated metal strips.

6. The device according to claim 4 wherein said plurality of bit lines is disposed within moat regions, said moat regions being surface areas of said substrate surrounded by thermally-grown silicon oxide and being at a level below that of the top of said oxide.

7. A static random access memory comprising:
    an array of a plurality of adjacent rows and columns of memory cells;
    a plurality of word lines for addressing said rows of memory cells in the array; and a plurality of bit lines for addressing said columns of memory cells in the array consisting of a single bit line disposed between each pair of said adjacent columns of memory cells, adjacent cells in each said pair of adjacent columns sharing said single bit line.

8. The device according to claim 7, wherein said plurality of word lines is comprised of elongated metal strips.

9. The device according to claim 7 wherein said plurality of bit lines is disposed within moat regions, said moat regions being surface areas of said substrate surrounded by thermally-grown silicon oxide and being at a level below that of the top of said oxide.

10. A static random access memory comprising: an array of a plurality of adjacent rows and columns of memory cells, said memory cells formed in a semiconductor integrated circuit having a semiconductor substrate and each cell including:
- a pair of driver transistors formed in said substrate at one face thereof;
- a pair of load devices;
- first conductive means at said one face connecting each of said driver transistors in series with one of said load devices, said first conductive means comprising a level of polycrystalline silicon which has been heavily doped with a conductivity-determining impurity; and
- second conductive means at said one face cross-connecting an output electrode of each said driver transistors to a control electrode of the other of said driver transistors;

the array including:
- a plurality of parallel word lines for addressing said rows of memory cells; and
- a plurality of parallel bit lines perpendicular to the row lines for addressing said columns of memory cells consisting of a single bit line disposed between each pair of said adjacent columns of memory cells, the cells in adjacent columns on opposite sides of each such single bit line sharing said single bit line so each column of cells uses two shared bit lines.

11. The device according to claim 10, wherein said plurality of word lines is comprised of elongated metal strips.

12. The device according to claim 10 wherein said plurality of bit lines is disposed within moat regions, said moat regions being surface areas of said substrate surrounded by thermally-grown silicon oxide and being at a level below that of the top of said oxide.

13. A static random access memory comprising: an array of a plurality of adjacent rows and columns of memory cells, said memory cells formed in a semiconductor integrated circuit having a semiconductor substrate and each cell including:
- a pair of driver transistors formed in said substrate at one face thereof;
- a pair of load devices;
- first conductive means at said one face connecting each of said driver transistors in series with one of said load devices; and
- second conductive means at said one face cross connecting an output electrode of each of said driver transistors to a control electrode of the other of said driver transistors;

the array including:
- a plurality of parallel word lines for addressing said rows of memory cells of the array; and
- a plurality of parallel bit lines perpendicular to the word lines for addressing said columns of memory cells of the array, said plurality of bit lines disposed within moat regions of said semiconductor integrated circuit, said moat regions being surface areas of said substrate surrounded by thermally-grown silicon oxide and being at a level below that of the top of said oxide, said plurality of bit lines consisting of a single bit line disposed between each pair of said adjacent columns of memory cells, whereby the memory cells on opposite sides of each of said single bit lines share the single bit line between them, each column using two such shared single bit lines.

14. The device according to claim 13, wherein said memory cells further include a first level of polycrystalline silicon on said one face providing said control electrodes of said driver transistors.

15. The device according to claim 14, wherein said first conductive means comprises a second level of polycrystalline silicon which has been heavily doped with a conductivity-determining impurity.

16. The device according to claim 15, wherein said pair of lead devices comprise regions within said second-level of polycrystalline silicon which are less heavily doped with said conductivity-determining impurity.

17. The device according to claim 16, wherein said plurality of word lines is comprised of elongated metal strips.

* * * * *